United States Patent
Cheng et al.

(10) Patent No.: US 9,214,550 B2
(45) Date of Patent: *Dec. 15, 2015

(54) QUASI-VERTICAL STRUCTURE HAVING A SIDEWALL IMPLANTATION FOR HIGH VOLTAGE MOS DEVICE

(71) Applicant: TAIWAN SEMICONDUCTOR MANUFACTURING COMPANY, LTD., Hsinchu (TW)

(72) Inventors: Chih-Chang Cheng, Hsinchu (TW); Ruey-Hsin Liu, Hsin-chu (TW)

(73) Assignee: TAIWAN SEMICONDUCTOR MANUFACTURING COMPANY, LTD. (TW)

(*) Notice: Subject to any disclaimer, the term of this patent is extended or adjusted under 35 U.S.C. 154(b) by 0 days.

This patent is subject to a terminal disclaimer.

(21) Appl. No.: 14/659,902

(22) Filed: Mar. 17, 2015

(65) Prior Publication Data

US 2015/0187936 A1 Jul. 2, 2015

Related U.S. Application Data

(63) Continuation of application No. 14/301,391, filed on Jun. 11, 2014, now Pat. No. 8,013,004, which is a continuation-in-part of application No. 13/875,698, filed on May 2, 2013, now Pat. No. 8,779,505, which is (Continued)

(51) Int. Cl.
*H01L 27/088* (2006.01)
*H01L 29/78* (2006.01)
(Continued)

(52) U.S. Cl.
CPC .......... *H01L 29/7827* (2013.01); *H01L 21/265* (2013.01); *H01L 29/0653* (2013.01);

(Continued)

(58) Field of Classification Search
CPC ..................... H01L 29/7827; H01L 29/66666; H01L 29/7816; H01L 29/105; H01L 29/66681; H01L 29/165; H01L 29/66659; H01L 29/41758; H01L 29/7395; H01L 29/7802; H01L 29/8083; H01L 21/76877; H01L 21/8238; H01L 2224/05093; H01L 27/2454; H01L 2924/13055; H01L 29/42304; H01L 29/66333; H01L 29/66386; H01L 29/735
USPC ......... 257/213–413, 900, 902, 903, 901, 592, 257/E21.41, E29.257, E21.615–E21.694, 257/E21.394–E21.458, E21.19–E21.21; 438/132, 142, 21, 223, 224, 203, 305, 438/199, 227, 228, 216, 261
See application file for complete search history.

(56) References Cited

U.S. PATENT DOCUMENTS 5,272,098 A * 12/1993 Smayling et al. ............ 438/268
6,831,346 B1 * 12/2004 Li et al. ........................ 257/499

(Continued)

OTHER PUBLICATIONS

Moens, P., et al., "Self-Heating Driven Vth Shifts in Integrated VDMOS Transistors", Proceedings of the 18th International Symposium on Power Semiconductor Devices & IC's, Jun. 4-8, 2006, Naples, Italy.

*Primary Examiner* — Dao H Nguyen
*Assistant Examiner* — Tram H Nguyen
(74) *Attorney, Agent, or Firm* — Hauptman Ham, LLP

(57) ABSTRACT

A semiconductor device includes a buried layer in a substrate, the buried layer having a first dopant type. The semiconductor device further includes a first layer over the buried layer, the first layer having the first dopant type. The semiconductor device further includes at least one first well in the first layer, the at least one first well having a second dopant type. The semiconductor device further includes an implantation region in a sidewall of the first layer, the implantation region having the second dopant type, wherein the implantation region is below the at least one first well. The semiconductor device further includes a metal electrode extending from the buried layer to a drain contact, wherein the metal electrode is insulated from the first layer and the at least one first well by an insulation layer.

20 Claims, 10 Drawing Sheets

Related U.S. Application Data a continuation of application No. 12/699,397, filed on Feb. 3, 2010, now Pat. No. 8,445,955.

(60) Provisional application No. 61/156,279, filed on Feb. 27, 2009.

(51) Int. Cl.
*H01L 29/66* (2006.01)
*H01L 29/417* (2006.01)
*H01L 29/06* (2006.01)
*H01L 29/786* (2006.01)
*H01L 29/08* (2006.01)
*H01L 29/40* (2006.01)
*H01L 21/265* (2006.01)

(52) U.S. Cl.
CPC .......... *H01L29/0882* (2013.01); *H01L 29/402* (2013.01); *H01L 29/41741* (2013.01); *H01L 29/41766* (2013.01); *H01L 29/66666* (2013.01); *H01L 29/66712* (2013.01); *H01L 29/7809* (2013.01); *H01L 29/78624* (2013.01); *H01L 21/26586* (2013.01)

(56) References Cited

U.S. PATENT DOCUMENTS

| | | | |
|---|---|---|---|
| 8,445,955 B2* | 5/2013 | Cheng et al. | 257/329 |
| 2003/0216007 A1* | 11/2003 | Lee et al. | 438/424 |
| 2004/0048487 A1* | 3/2004 | Saita et al. | 438/714 |
| 2006/0017092 A1* | 1/2006 | Dong et al. | 257/314 |
| 2008/0016069 A1* | 1/2008 | Holt | 707/6 |
| 2008/0160697 A1* | 7/2008 | Kao | 438/268 |
| 2009/0093133 A1* | 4/2009 | Doris et al. | 438/781 |
| 2009/0298288 A1* | 12/2009 | Seino et al. | 438/683 |
| 2010/0076318 A1* | 3/2010 | Rehrig et al. | 600/466 |
| 2010/0117188 A1* | 5/2010 | Waldrab et al. | 257/506 |
| 2012/0108033 A1* | 5/2012 | Gonzalez et al. | 438/430 |
| 2012/0115283 A1* | 5/2012 | Maekawa et al. | 438/151 |
| 2012/0178204 A1* | 7/2012 | Toor et al. | 438/71 |
| 2014/0284706 A1* | 9/2014 | Cheng et al. | 257/329 |

* cited by examiner

QUASI-VERTICAL STRUCTURE HAVING A SIDEWALL IMPLANTATION FOR HIGH VOLTAGE MOS DEVICE

PRIORITY CLAIM

The present application is a continuation of U.S. application Ser. No. 14/301,391, filed Jun. 11, 2014, which is a continuation-in-part of U.S. application Ser. No. 13/875,698, filed May 2, 2013, which is a continuation of U.S. application Ser. No. 12/699,397, filed Feb. 3, 2010, which claims the priority of U.S. Application No. 61/156,279, filed Feb. 27, 2009, which are incorporated herein by reference in their entireties.

TECHNICAL FIELD

Embodiments described herein relate generally to integrated circuits, and more particularly to metal-oxide-semiconductor (MOS) devices, and even more particularly to a MOS structure for high voltage operations.

BACKGROUND

Many metal-oxide-semiconductor field-effect transistors (MOSFET) designed for high voltage applications (with high breakdown voltage) have a vertical structure. Using a vertical structure, it is possible for the transistor to sustain both high blocking voltage and high current. The voltage rating of the transistor is a function of the doping and thickness of the n-epitaxial layer ("n-epi layer") in the case of NMOS, while the current rating is a function of the channel width (i.e. the wider the channel, the higher the current). In a planar structure, the current and breakdown voltage ratings are both a function of the channel dimensions (respectively width and length of the channel), resulting in inefficient use of the "silicon estate." With the vertical structure, the component area is roughly proportional to the current it can sustain, and the component thickness (actually the n-epi layer thickness) is proportional to the breakdown voltage. Vertical MOSFETs are usually designed for switching applications. In general, NMOS is used instead of PMOS for many applications due to better performance given the same dimensions (because of higher mobility of electrons than holes).

In a conventional vertical NMOS, an n+ sinker is generally used for a vertical drain current collection. FIG. 1 illustrates a cross-section of a conventional vertical NMOS with a p-substrate. The vertical NMOS has a p-substrate 102, an n+ buried layer (NBL) 104 and an n-sinker 108 for a vertical drain current collection, an n-epi layer 106, p-bodies 110, source n+ regions 112 and p+ regions 114 both connected to the source contact 116, a gate 118, and a drain contact 120. The n-sinker 108 requires a large lateral space 122 for isolation between the source 116 and the drain 120. However, the required space 122 for the isolation will increase the device area and lead to an increased $R_{DS}$on (drain to source resistance in on-state). In addition, the profile of the n-sinker 108 is hard to control because of different thermal budget. The n-sinker 108 is used as a vertical connection between NBL 104 and drain contact 120. Since a high-energy implant step has its limitation in the implant depth, a larger thermal driver-in is required to push implant atoms deeper. In this kind of thermal, the n-sinker 108 receives a large thermal budget (temperature×hours) and results in an isotropic diffusion. Thus, the profile of n-sinker 108 becomes broader and deeper, which leads to a connection of NBL 104 with n-sinker 108 having an unwanted device area. Further, a multi-implant step is required for a deep n-sinker 108. Therefore, the body of the n-sinker 108 will become broader than expectation and the body of n-sinker 108 occupies an extra device area.

FIG. 2 illustrates a cross-section of another conventional vertical NMOS with a silicon-on-insulator (SOI) wafer. The NMOS has a p-substrate 102, a buried oxide (BOX) layer 202, n+ regions 204 connected to a drain contact 120, an n-epi layer 106, p-wells 210, source n+ regions 112 and p+ regions 114 both connected to the source contact 116, a gate 118, and isolation oxide layers 206 and 208. The oxide layers 206 and 208 provide pn-junction isolation and a higher break down voltage. The BOX layer 202 is also required for high voltage operation. Still, this structure requires a large lateral space 122 for isolation between the source 116 and the drain 120.

Accordingly, new methods and structures to reduce the required device area and to have a high breakdown voltage for high-side operations are needed.

BRIEF DESCRIPTION OF THE DRAWINGS

Reference is now made to the following descriptions taken in conjunction with the accompanying drawings, in which.

DETAILED DESCRIPTION

The making and using of the presently preferred embodiments are discussed in detail below. It should be appreciated, however, that the disclosed embodiments provide many applicable inventive concepts that can be embodied in a wide variety of specific contexts. The embodiments discussed are merely illustrative of specific ways to make and use the semiconductor device, and do not limit the scope of the device.

A metal-oxide-semiconductor (MOS) device structure for high breakdown voltage (BV) and low turn-on resistance $R_{DS}$on in high voltage operations is provided. An embodiment of the structure and a method to fabricate the structure is provided, and the variations of the structure and method are also discussed. Throughout the various views and illustrative embodiments, like reference numbers are used to designate like elements.

Figure 1:
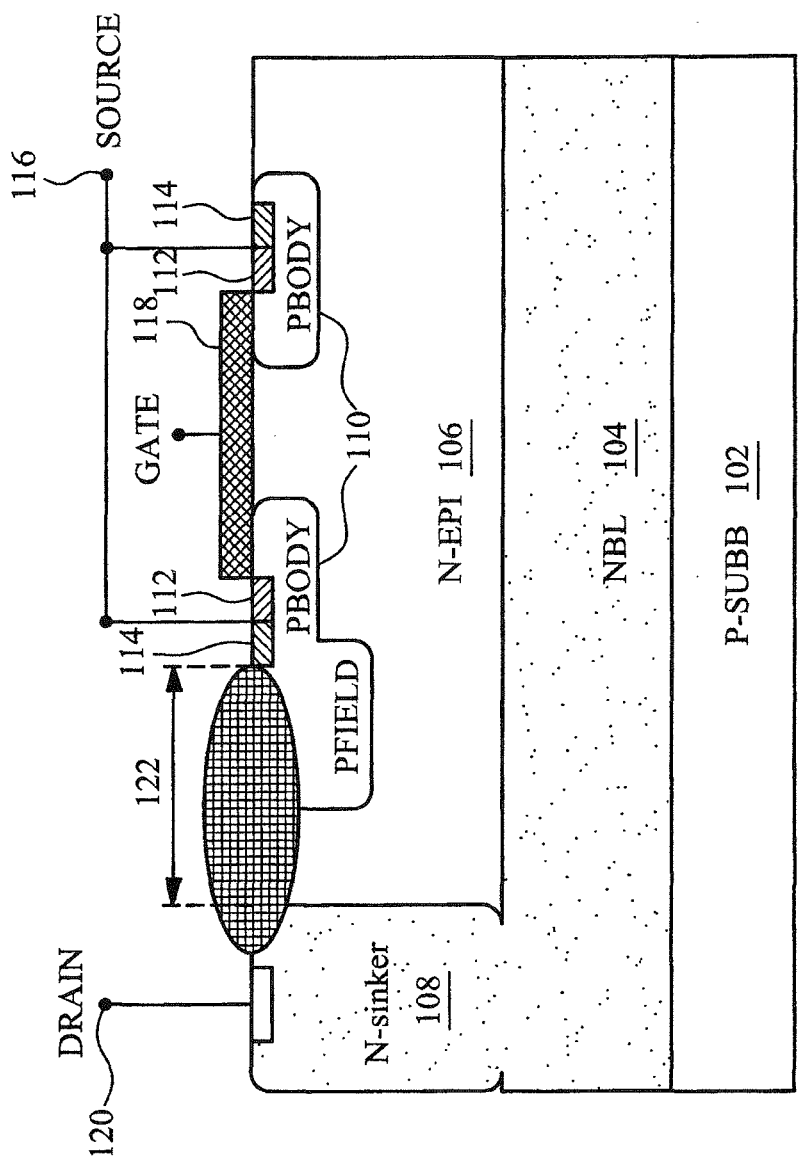
FIG. 1 is a cross-sectional view of a conventional vertical NMOS device with a p-substrate.
Figure 2:
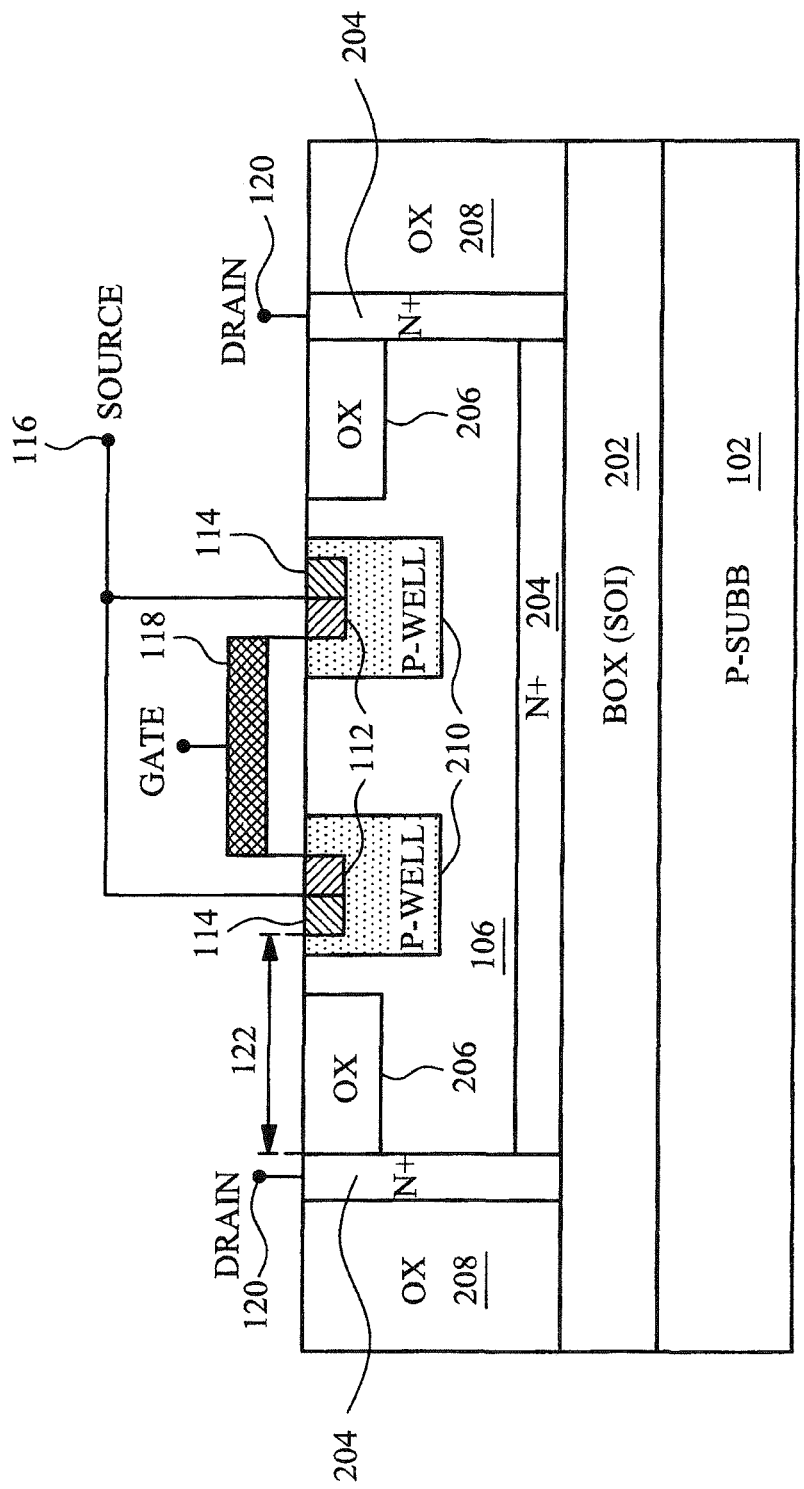
FIG. 2 is a cross-sectional view of another conventional vertical NMOS with a SOI wafer.
Figure 3:
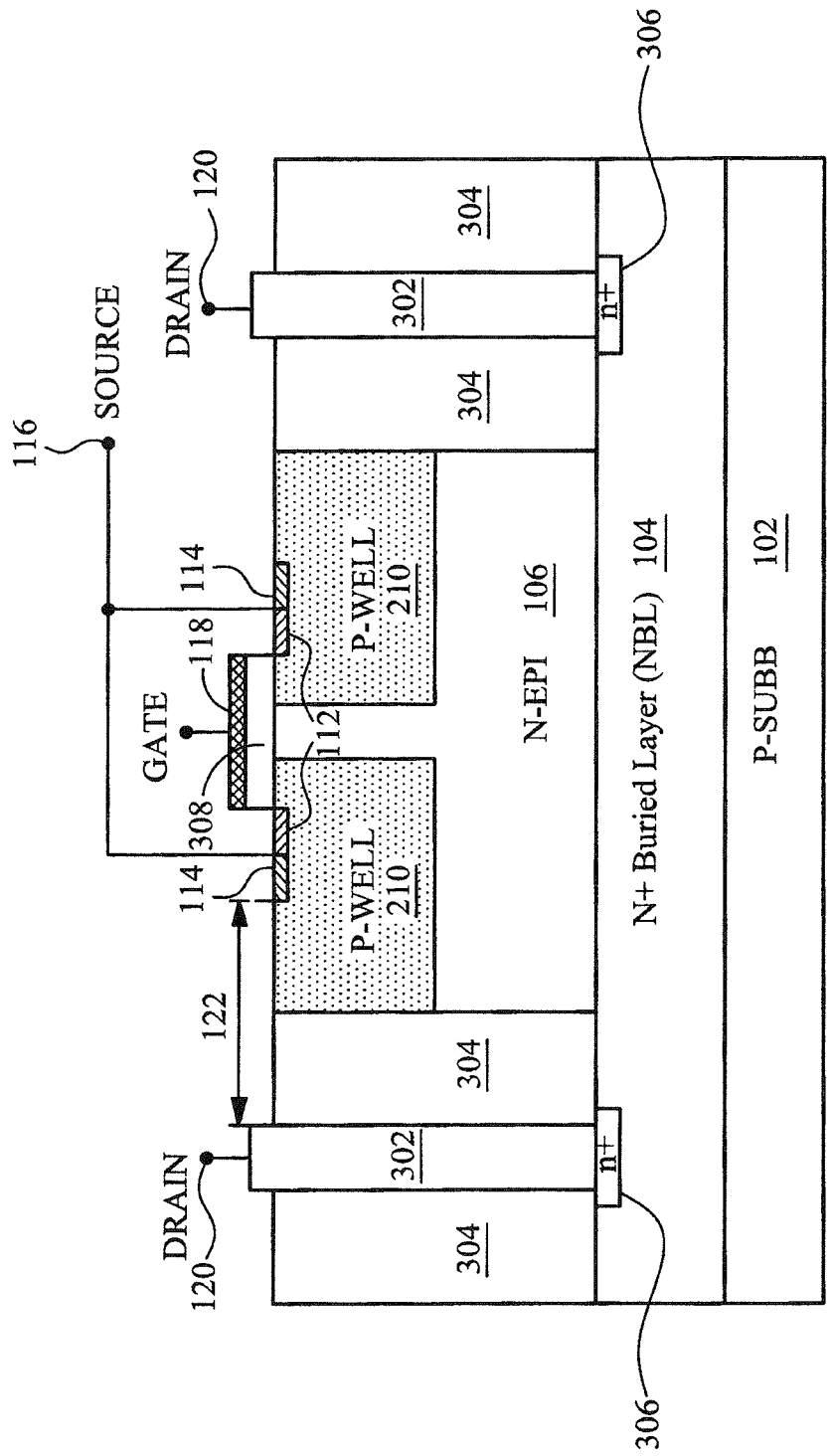
FIG. 3 is a cross-sectional view of a vertical NMOS having a deep electrode for vertical drain current collection, according to some embodiments.

FIG. 3 illustrates a cross-section of an example embodiment of a vertical NMOS device, and includes a deep electrode for vertical drain current collection. The vertical NMOS has a P-substrate 102, an n+ buried layer (NBL) 104, an n-epi layer 106, p-wells 210, source n+ regions 112 and p+ regions 114 both connected to the source contact 116, a gate 118, and a drain contact 120. Also, there are deep electrodes 302 connected to the drain contact 120 for a vertical drain current collection, n+ regions 306 under the deep electrodes 302 to reduce contact resistance, and insulation layers 304 surrounding the deep electrodes 302. The electrodes 302 can be implemented using metal or polysilicon, for example. The insulation layers 304 surrounding electrodes 302 can be dielectric material, e.g. oxide, and can be in a circular shape. The structure, including electrodes 302 and NBL 104 to collect vertical drain current, enable high-side operations.

In one embodiment, metal electrodes 302 and oxide insulation layer 304 enable high voltage operations of more than 700V. Also, because of a stronger oxide dielectric insulation layer 304 compared to silicon, a more robust breakdown voltage is possible. Further, the device area can be reduced because of the effective insulation using the insulation layer 304 surrounding electrodes 302, because the lateral space 122 needed for isolation between the source 116 and the drain 120 reduced.

Figure 4:
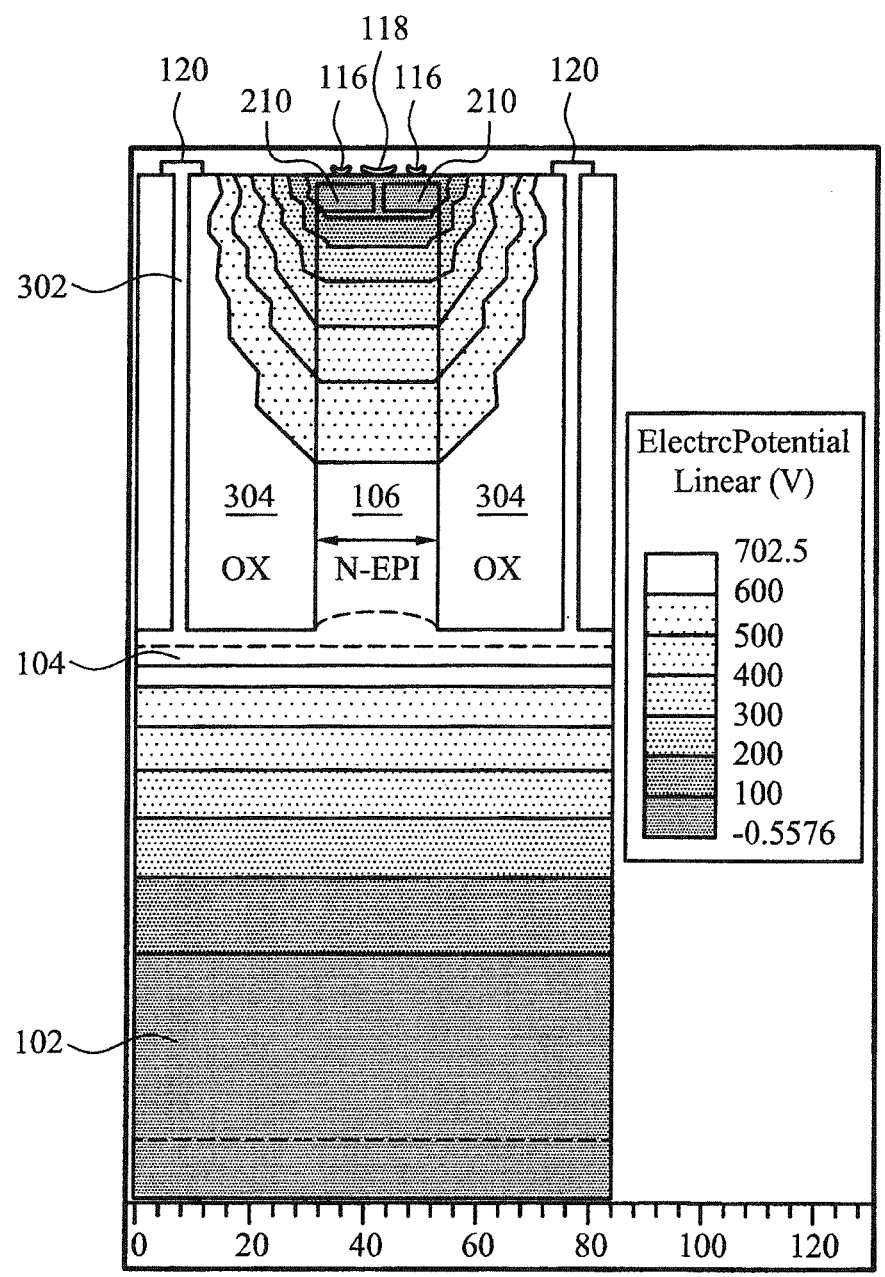
FIG. 4 is a graph of a potential (voltage) distribution for the structure of FIG. 3, according to some embodiments.

FIG. 4 illustrates an example potential (voltage) distribution for the structure shown in FIG. 3, wherein electrodes 302 are metal and insulation layers 304 are oxide in FIG. 4. In FIG. 4, the p-substrate 102, the source contact 116, the gate 118, and the p-wells 210 show relative low voltage close to the surface (top or bottom), about less than 100V. The potential (voltage) increases as the location in the cross section diagram moves close to the electrodes 302, NBL 104, and the drain contact 120, to over 700V. The oxide insulation layer 304, n-epi layer 106, and p-substrate 102 show gradual variation of potential from less than 100V to over 700V, showing that the structure can sustain a high-side operation over 700V.

Figure 5:
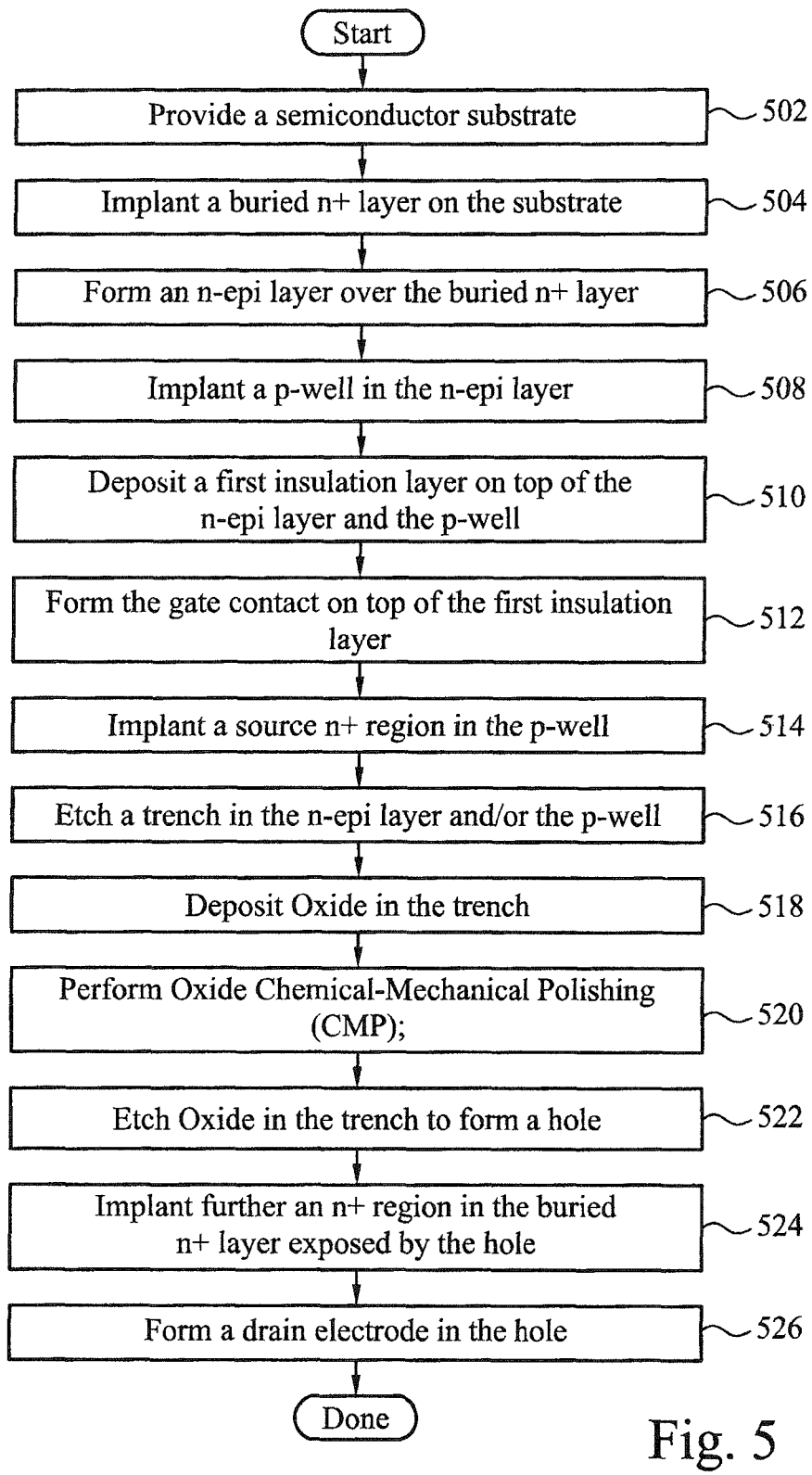
FIG. 5 is a flow diagram of an exemplary process to fabricate the device according to FIG. 3, according to some embodiments.

FIG. 5 illustrates a flow diagram showing an exemplary process to fabricate one embodiment of the NMOS device. At step 502, a semiconductor substrate (i.e. p-substrate 102) is provided for fabrication of the MOS device. At step 504, a buried n+ layer is implanted on the substrate to form the NBL 104. At step 506, an n-epi layer 106 is formed over the buried n+ layer 104. At step 508, a p-well 210 is implanted in the n-epi layer 106. At step 510, a first insulation layer 308 is deposited on top of the n-epi layer 106 and the p-well 210, where the first insulation layer 308 covers only a specified area for a gate 118. The first insulation layer 308 can be a high voltage oxide layer in one embodiment. At step 512, the gate 118 is formed on top of the first insulation layer 308. The gate 308 can be formed by performing polysilicon deposition and etching, for example. At step 514, a source n+ region 112 is implanted in the p-well 210. In one embodiment, a p+ region adjoining the source n+ region can be implanted to be connected to the source contact 116 together. At step 516, a trench is etched in the n-epi layer 106 and/or the p-well 210 to expose the buried n+ layer 104 and provide space for the drain electrode 302 and an oxide insulation layer 304 that surrounds the electrode 302. At step 518, oxide is deposited in the trench to form an insulation layer 304. At step 520, oxide Chemical-Mechanical Polishing (CMP) is performed. In another embodiment, it is possible to use "etch-back method" instead of CMP, especially for breakdown voltages smaller than 500V. At step 522, oxide in the trench is etched to form a hole that extends to the buried n+ layer to provide space for the electrode 302. At step 524, an n+ region 306 can be further implanted in the buried n+ layer exposed by the hole to improve the contact resistance of the electrode 302 to the buried n+ layer 104. At step 526, a drain electrode 302 is formed in the hole. The drain electrode 302 is one of metal and polysilicon, and it can be formed by depositing and etching metal or polysilicon.

Figure 6:
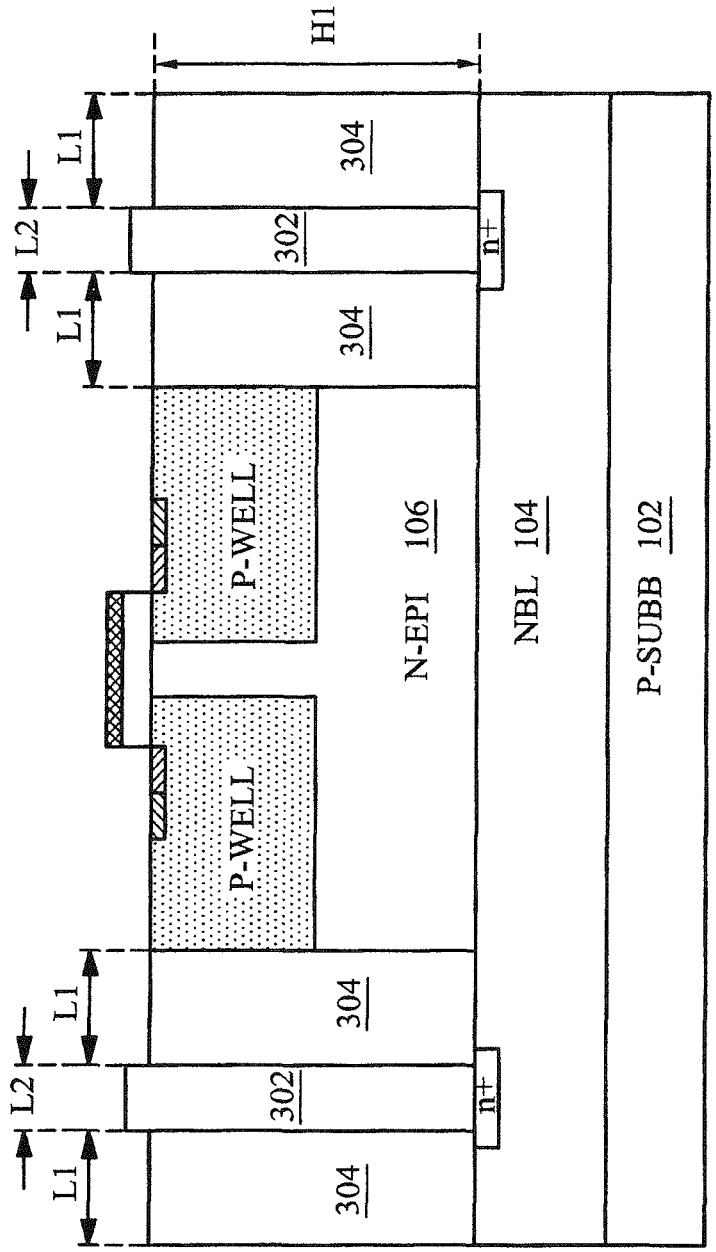
FIG. 6 is a cross-sectional view of an exemplary geometry of the device of FIG. 3, according to some embodiments.

FIG. 6 illustrates example geometry of the structure shown in FIG. 3. FIG. 6 shows a symmetric lateral length L1 of the insulation layer 304 around the electrode 302, the lateral length L2 of the electrode 302, and the height H1 of the insulation layer 304. The aspect ratio is the height (i.e. H1) over the lateral length (i.e. L1 or L2). In this example, for a value of L1=24 um, the aspect ratio is 2.08-3.33 for a value of H1=50 um~80 um. For the value of L2, 3 um-10 um is given in this example with an aspect ratio of 10~20. The aspect ratio can depend upon the etching capability in the process, e.g. the depth and precision that a deep trench can be etched for a small area.

Features of the disclosed embodiments include high operating voltage (e.g. in one embodiment, more than 700V was achieved), reduction of device area because of dielectric isolation (e.g. oxide), and a more robust breakdown voltage because of a stronger dielectric insulation (e.g. oxide) compared to silicon.

Figure 7:
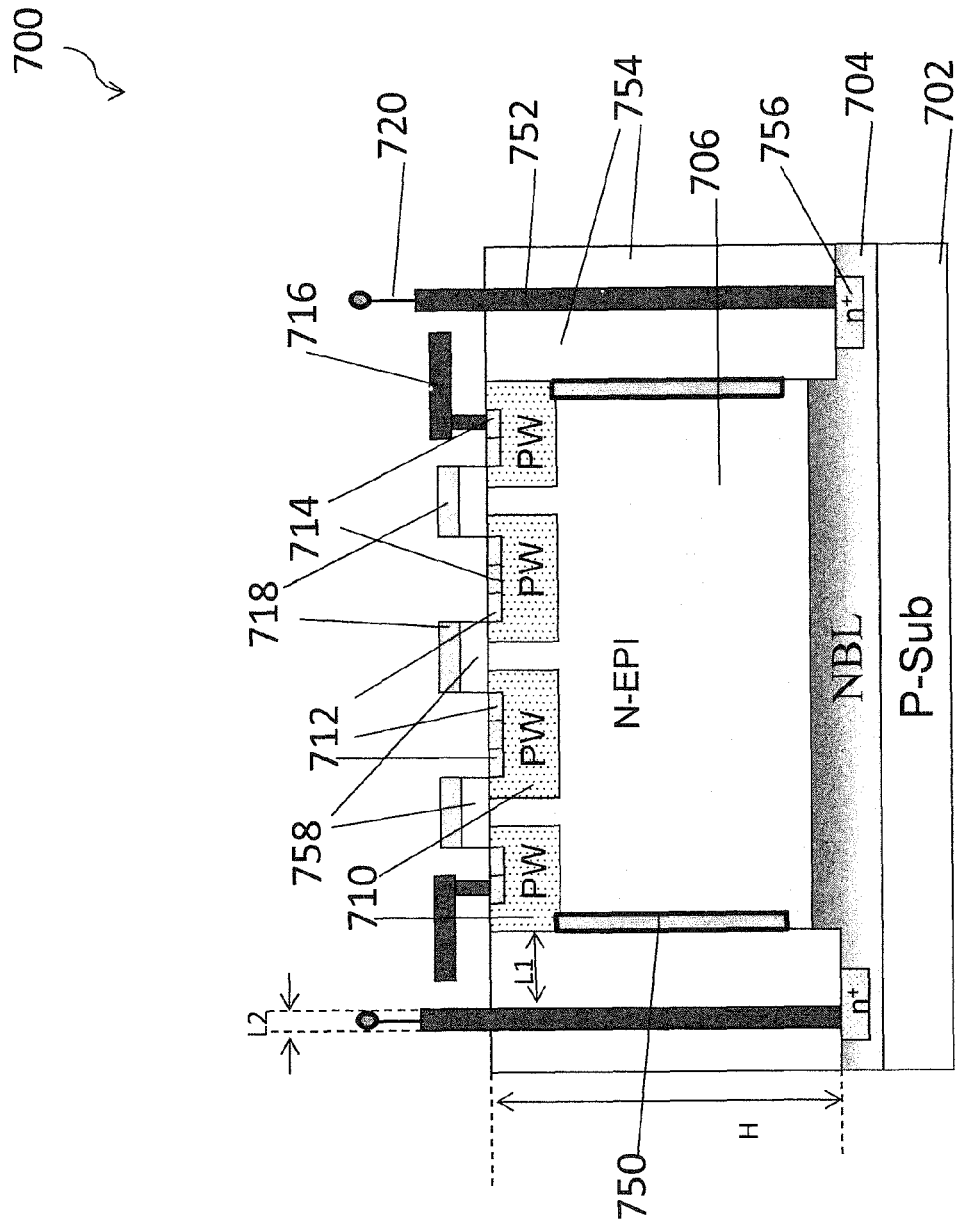
FIGS. 7 and 7A are cross-sectional views of a vertical NMOS, according to some embodiments.

FIG. 7 is a cross-sectional view of a vertical NMOS 700, according to some embodiments. Vertical NMOS 700 is similar to the vertical NMOS of FIG. 3. Vertical NMOS 700 has a P-substrate 702 and an n+ buried layer (NBL) 704 over a top surface of the P-substrate. Vertical NMOS 700 further includes an n-epi layer 706 epitaxially grown over NBL 704. P-wells 710 are formed within n-epi layer 706. Highly doped n+ source regions 712 and p+ source regions 714 are formed in p-wells 710. Highly doped n+ source regions 712 in a same p-well 710 are separated by highly doped p+ source regions 714. Multiple gates 718 are formed over n-epi layer 706 to electrically connect separate highly doped n+ source regions 712. Highly doped p+ source regions 714 in p-wells 710 adjacent to sidewalls of n-epi layer 706 are connected to a source contact by field plates 716. A drain contact 720 is connected to NBL 704. Sidewall implants 750 are formed in portions of sidewalls of n-epi layer 706 below p-wells 710.

Deep electrodes 752 are connected to drain contact 720 for a vertical drain current collection. N+ regions 756 in NBL 704 are connected to deep electrodes 752 to help reduce contact resistance between the NBL and the deep electrodes. Insulation layers 754 surround deep electrodes 752 to isolate the deep electrodes from n-epi layer 706 and adjacent devices.

In some embodiments, a length L1 between p-well 710 adjacent to insulation layer 754 and deep electrode 752 ranges from about 5 microns (μm) to about 30 p.m. If length L1 is less than about 5 μm, insulation layer 754 does not provide sufficient insulation between p-well 710 and deep electrode 752, in some embodiments. If length L1 is greater than about 30 μm, a size of vertical NMOS 700 is increased without significant improvement in functionality, in some embodiments. In some embodiments, a length L2 from one side of deep electrode 752 to an opposite side of the deep electrode ranges from about 0.1 μm to about 5 μm. If length L2 is less than about 0.1 μm, a resistance of deep electrode 752 prevents efficient charge transfer along the deep electrode, in some embodiments. If length L2 is greater than about 30 μm, a size of deep electrode 752 is increased without significant improvement in functionality, in some embodiments. In some embodiments, a height H of insulation layer 754 ranges from about 10 μm to about 80 μm. If height H is less than about 10 μm, current leakage from p-well 710 to NBL 704 is increased, in some embodiments. If height H is greater than about 80 μm, an overall resistance of deep electrode 752 is significantly increased due to the height of the deep electrode, in some embodiments.

Figure 7A:
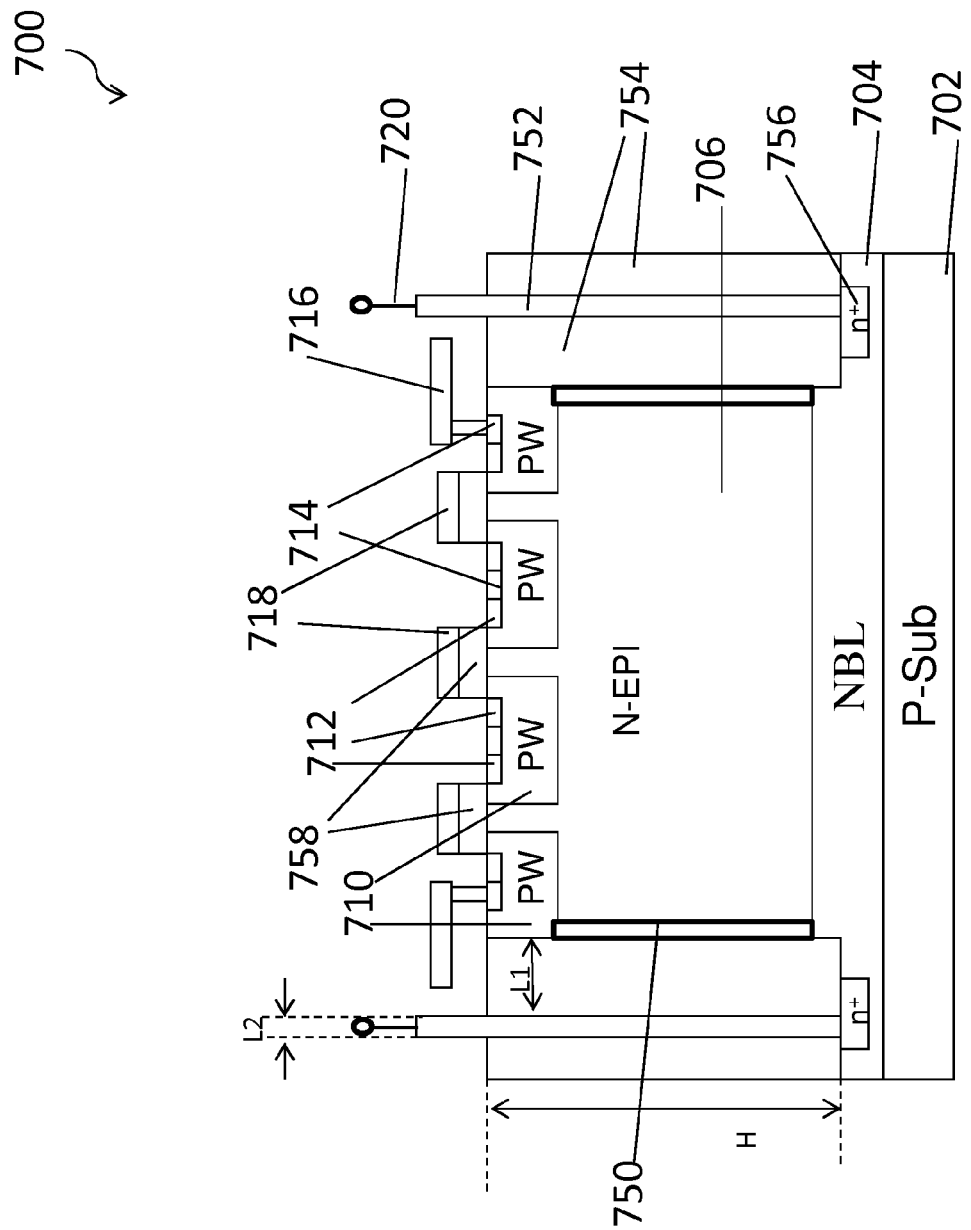

In comparison with the vertical NMOS of FIG. 3, vertical NMOS 700 includes sidewall implants 750. Sidewall implants 750 are p-type dopants implanted into sidewalls of n-epi layer 706. In some embodiments, a dopant concentration within sidewall implants 750 ranges from about 1E15 atoms/cm$^3$ to about 1E17 atoms/cm$^3$. In some embodiments, the dopant concentration of sidewall implants 750 is less than a dopant concentration of p-wells 710. In some embodiments, the dopant concentration of sidewall implants 750 is substantially equal to the dopant concentration of p-wells 710. Sidewall implants 750 are positioned below p-wells 710 in n-epi layer 706. In some embodiments, sidewall implants 750 cover an entire sidewall of n-epi layer 706 below p-wells, as in FIG. 7A. In some embodiments, a portion of n-epi layer 706 adjacent to insulation layers 754 is free of sidewall implants 750.

Sidewall implants 750 help to increase a breakdown voltage of vertical NMOS 700. In some embodiments, the breakdown voltage of vertical NMOS 700 is greater than 850 V. In some embodiments, the breakdown voltage of vertical NMOS 700 is approximately 900 V.

Vertical NMOS 700 also includes multiple gates 718. Each gate 718 extends between adjacent p-wells 710. Vertical NMOS 700 includes three gates 718. In some embodiments, vertical NMOS 700 includes more or less than three gates 718. In some embodiments, a number of gates 718 ranges is less than or equal to about 6. The use of multiple gates helps to reduce resistance between drain contact 720 and field plates 716 connected to highly doped source regions 712 and 714. In some embodiments, gates 718 are formed simultaneously. In some embodiments, at least one gate 718 is formed sequentially with at least another gate 718.

Vertical NMOS 700 also includes field plates 716. In some embodiments, field plates 716 are metal field plates. Field plates 716 are connected to highly doped source regions 712 and 714 in p-wells 710 adjacent to sidewall implants 750. Field plates 716 help to increase a breakdown voltage of vertical NMOS 700.

Figure 8:
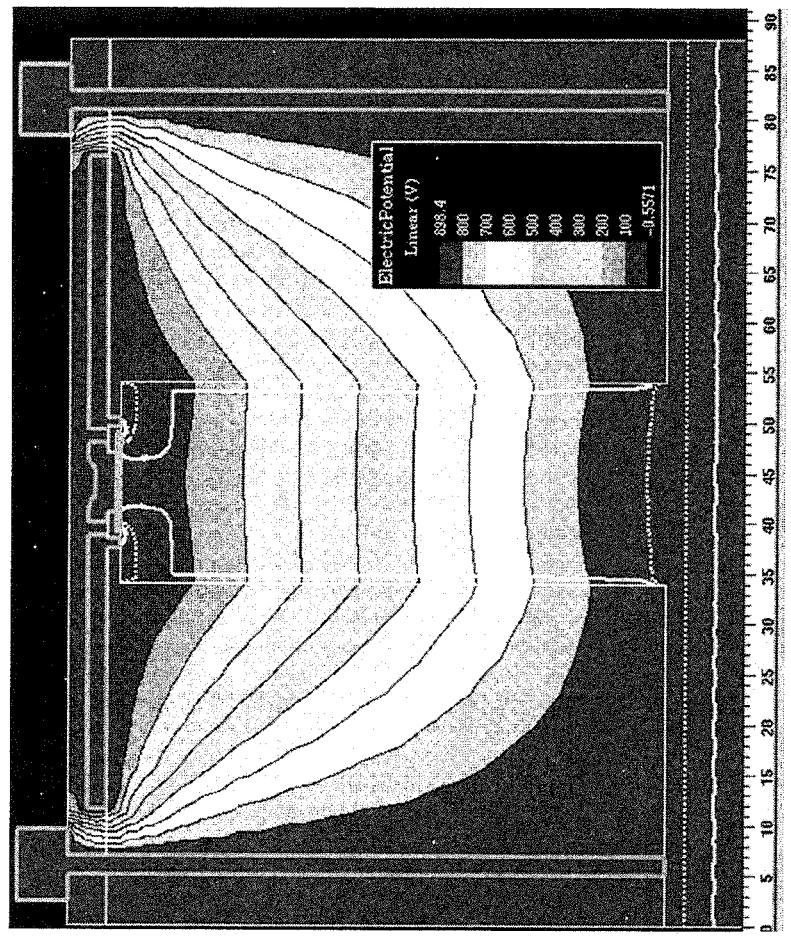
FIG. 8 is a graph of a potential (voltage) distribution for the structure of FIG. 7, according to some embodiments.

FIG. 8 is a graph of a potential (voltage) distribution for the structure of FIG. 7, according to some embodiments. In FIG. 8, the p-substrate 702, field plates 716, the gate 718, and the p-wells 710 have relative low voltage close to the surface (top or bottom), about less than 100V. The potential (voltage) increases as the location in the cross section diagram moves close to deep electrodes 752, NBL 704, and drain contact 720, to close to 900V. Insulation layer 754, n-epi layer 706, and p-substrate 702 have gradual variation of potential from less than 100V to almost 900V, indicating that vertical NMOS 700 is capable of sustaining a voltage of close to 900V.

Figure 9:
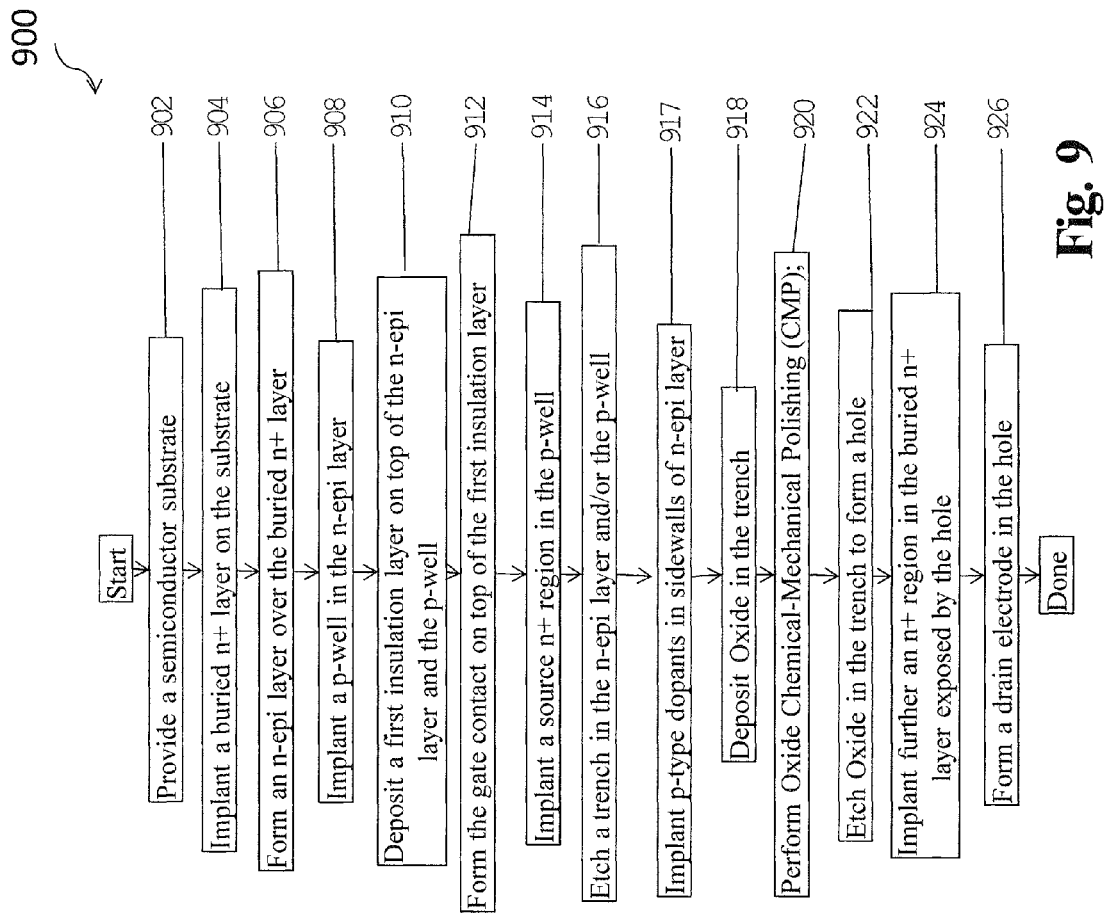
FIG. 9 is a flow diagram of an exemplary process to fabricate the device according to FIG. 7, according to some embodiments.

FIG. 9 is a flow diagram of an exemplary process 900 to fabricate the device according to FIG. 7, according to some embodiments. Process 900 is similar to the process of FIG. 5. In comparison with the process of FIG. 9, process 900 includes operation 917 in which p-type dopants are implanted into sidewalls of n-epi layer. In some embodiments, the p-type dopants are implanted using an angled ion implantation process or another suitable implantation process. In some embodiments, the ion dosage of for implanting dopants in the sidewalls ranges from about 1E11 atoms/cm$^2$ to about 1E13 atoms/cm$^2$. In some embodiments, an annealing process is included in operation 917 to help drive the p-type dopants further into the n-epi layer. In some embodiments, the annealing process is a rapid thermal anneal, a microsecond anneal, or another suitable annealing process.

One aspect of this description relates to a semiconductor device. The semiconductor device includes a buried layer in a substrate, the buried layer having a first dopant type. The semiconductor device further includes a first layer over the buried layer, the first layer having the first dopant type. The semiconductor device further includes at least one first well in the first layer, the at least one first well having a second dopant type. The semiconductor device further includes an implantation region in a sidewall of the first layer, the implantation region having the second dopant type, wherein the implantation region is below the at least one first well. The semiconductor device further includes a metal electrode extending from the buried layer to a drain contact, wherein the metal electrode is insulated from the first layer and the at least one first well by an insulation layer.

Another aspect of this description relates to a method of fabricating a semiconductor device. The method includes implanting a buried layer on a substrate, the buried layer having a first dopant type. The method further includes forming a first layer over the buried layer, the first layer having the first dopant type. The method further includes implanting at least one first well in the first layer, the at least one well having a second dopant type. The method further includes implanting a sidewall implant into a sidewall of the first layer below the at least one first well, the sidewall implant having the second dopant type. The method further includes depositing an oxide in a trench in the first layer or the at least one first well, wherein the trench exposes a first portion of the buried layer. The method further includes forming a hole in the oxide that exposes a second portion of the buried layer. The method further includes forming a drain electrode in the hole.

Still another aspect of this description relates to a semiconductor device. The semiconductor device includes a buried layer in a substrate, the buried layer having a first dopant type. The semiconductor device further includes a first layer over the buried layer, the first layer having the first dopant type. The semiconductor device further includes a plurality of first wells in the first layer, the plurality of first well having a second dopant type. The semiconductor device further includes an implantation region in a sidewall of the first layer below the plurality of first wells, the implantation region having the second dopant type. The semiconductor device further includes a metal electrode extending from the buried layer to a drain contact. The semiconductor device further includes an insulation layer positioned to completely separate the metal electrode from the first layer.

Although the embodiments and their features have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:
1. A semiconductor device, comprising:
    a buried layer in a substrate, the buried layer having a first dopant type;
    a first layer over the buried layer, the first layer having the first dopant type;
    at least one first well in the first layer, the at least one first well having a second dopant type;

an implantation region in a sidewall of the first layer, the implantation region having the second dopant type, wherein the implantation region is below the at least one first well; and a metal electrode extending from the buried layer to a drain contact, wherein the metal electrode is insulated from the first layer and the at least one first well by an insulation layer.

2. The semiconductor device of claim 1, wherein a bottom surface of the implantation region is spaced from a top surface of the buried layer.

3. The semiconductor device of claim 1, wherein a bottom surface of the implantation region contacts a top surface of the buried layer.

4. The semiconductor device of claim 1, wherein a breakdown voltage of the semiconductor device is greater than 850 volts (V).

5. The semiconductor device of claim 1, wherein a dopant concentration in the implantation region is less than a dopant concentration of the at least one first well.

6. The semiconductor device of claim 1, further comprising a contact region in the buried layer, wherein the metal electrode contacts the contact region.

7. The semiconductor device of claim 6, wherein a dopant concentration of the contact region is greater than a dopant concentration of the buried layer.

8. The semiconductor device of claim 1, wherein the at least one first well is a plurality of first wells.

9. The semiconductor device of claim 8, further comprising a plurality of gate structures configured to selectively connect corresponding first wells of the plurality of first wells.

10. The semiconductor device of 1, further comprising a field plate electrically connected to the at least one first well on an opposite side of the at least one first well from the implantation region.

11. A method of fabricating a semiconductor device, the method comprising:

implanting a buried layer on a substrate, the buried layer having a first dopant type;

forming a first layer over the buried layer, the first layer having the first dopant type;

implanting at least one first well in the first layer, the at least one well having a second dopant type;

implanting a sidewall implant into a sidewall of the first layer below the at least one first well, the sidewall implant having the second dopant type;

depositing an oxide in a trench in the first layer or the at least one first well, wherein the trench exposes a first portion of the buried layer;

forming a hole in the oxide that exposes a second portion of the buried layer; and forming a drain electrode in the hole.

12. The method of claim 11, wherein implanting the sidewall implant comprises implanting the sidewall implant having a bottom surface of the implantation region is spaced from a top surface of the buried layer.

13. The method of claim 11, wherein implanting the sidewall implant comprises implanting the sidewall implant having a bottom surface of the implantation region contacts a top surface of the buried layer.

14. The method of claim 11, wherein forming the first layer comprises epitaxially growing the first layer over the buried layer.

15. The method of claim 11, wherein implanting the sidewall implant comprises implanting the sidewall implant having a dopant concentration less than a dopant concentration of the at least one first well.

16. The method of claim 11, further comprising implanting a contact region in the buried layer, wherein the drain electrode contacts the contact region.

17. The method of claim 16, wherein implanting the contact region comprises implanting the contact region having a dopant concentration greater than a dopant concentration of the buried layer.

18. A semiconductor device, comprising:

a buried layer in a substrate, the buried layer having a first dopant type;

a first layer over the buried layer, the first layer having the first dopant type;

a plurality of first wells in the first layer, the plurality of first well having a second dopant type;

an implantation region in a sidewall of the first layer below the plurality of first wells, the implantation region having the second dopant type;

a metal electrode extending from the buried layer to a drain contact; and an insulation layer positioned to completely separate the metal electrode from the first layer.

19. The semiconductor device of claim 18, further comprising at least one gate over the plurality of first wells, wherein a number of gates of the at least one gate is less than or equal to six.

20. The semiconductor device of claim 18, wherein a breakdown voltage of the semiconductor device is greater than 900 volts (V).

* * * * *